(12) United States Patent
Kim et al.

(10) Patent No.: US 12,315,754 B2
(45) Date of Patent: May 27, 2025

(54) APPARATUS AND METHOD FOR SELF-ASSEMBLING SEMICONDUCTOR LIGHT EMITTING DIODES

(71) Applicant: LG ELECTRONICS INC., Seoul (KR)

(72) Inventors: Kisu Kim, Seoul (KR); Jinhyung Lee, Seoul (KR); Yongil Shin, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 277 days.

(21) Appl. No.: 18/024,371

(22) PCT Filed: Sep. 29, 2020

(86) PCT No.: PCT/KR2020/013298
§ 371 (c)(1),
(2) Date: Mar. 2, 2023

(87) PCT Pub. No.: WO2022/071613
PCT Pub. Date: Apr. 7, 2022

(65) Prior Publication Data
US 2023/0317491 A1    Oct. 5, 2023

(51) Int. Cl.
*H01L 21/683* (2006.01)
*H01L 25/075* (2006.01)

(52) U.S. Cl.
CPC ...... *H01L 21/6833* (2013.01); *H01L 25/0753* (2013.01)

(58) Field of Classification Search
CPC .................. H01L 21/6833; H01L 25/0753
See application file for complete search history.

(56) References Cited

U.S. PATENT DOCUMENTS

| 9,825,202 | B2 | 11/2017 | Schuele et al. |
| 2002/0005294 | A1* | 1/2002 | Mayer ............... B82Y 30/00 257/E21.705 |

(Continued)

FOREIGN PATENT DOCUMENTS

| KR | 10-1815048 B1 | 1/2018 |
| KR | 10-2019-0017691 A | 2/2019 |

(Continued)

*Primary Examiner* — Scott Bauer
(74) *Attorney, Agent, or Firm* — Birch, Stewart, Kolasch & Birch, LLP

(57) ABSTRACT

A semiconductor light emitting diode self-assembling device according to the present invention comprises: an assembly chamber in which fluid and semiconductor light emitting diodes are received; a magnetic chuck disposed above the assembly chamber and applying, while moving in a horizontal direction, a magnetic force thereto so as to induce movement of the semiconductor light emitting diodes in the assembly chamber; a substrate chuck for placing an assembly substrate, on which the semiconductor light emitting diodes in the assembly chamber are seated, between the assembly chamber and the magnetic chuck and supporting the assembly substrate; and a control part for controlling the driving of the magnetic chuck and the substrate chuck, wherein the magnetic chuck includes: a magnetic force forming part including a plurality of magnets; and a vacuum forming part for correcting a bending phenomenon of the assembly substrate by using vacuum pressure between the plurality of magnets so as to maintain a predetermined interval between one side of the magnetic chuck and the assembly substrate.

16 Claims, 14 Drawing Sheets

(56) References Cited

U.S. PATENT DOCUMENTS

| | | | | |
|---|---|---|---|---|
| 2008/0301932 A1* | 12/2008 | Murata | ............. | H05K 13/0069 |
| | | | | 29/832 |
| 2018/0102352 A1* | 4/2018 | Sasaki | .................... | H01L 25/50 |
| 2019/0058080 A1 | 2/2019 | Ahmed et al. | | |
| 2019/0296184 A1* | 9/2019 | Ahmed | ................. | A01N 1/146 |

FOREIGN PATENT DOCUMENTS

| | | |
|---|---|---|
| KR | 10-2019-0122113 A | 10/2019 |
| KR | 10-2020-0026765 A | 3/2020 |
| KR | 10-2020-0048762 A | 5/2020 |
| KR | 10-2145016 B1 | 8/2020 |

* cited by examiner (a)

(b)

APPARATUS AND METHOD FOR SELF-ASSEMBLING SEMICONDUCTOR LIGHT EMITTING DIODES

CROSS REFERENCE TO RELATED APPLICATIONS

This application is the National Phase of PCT International Application No. PCT/KR2020/013298, filed on Sep. 29, 2020, which is hereby expressly incorporated by reference into the present application.

TECHNICAL FIELD

The present disclosure relates to an apparatus for self-assembling semiconductor light emitting diodes on a substrate and a self-assembly method using the same in manufacturing a display device using the semiconductor light emitting diodes, particularly, semiconductor light emitting diodes each having a size of several to several tens of $\mu m$.

BACKGROUND ART

In recent years, in the field of display technology, liquid-crystal displays (LCDs), organic light-emitting diodes (OLED) displays, semiconductor light-emitting displays, etc. have been competing to realize large-area displays.

Semiconductor light-emitting devices (elements, diodes) (hereinafter, microLEDs) with a cross-sectional area of 100 $\mu m$, when used in displays, may offer very high efficiency because the displays do not need a polarizer to absorb light. However, in order to implement large-scale displays, several millions of semiconductor light-emitting devices (elements) are required, which makes it difficult to transfer the semiconductor light-emitting devices, compared to other technologies.

In recent years, microLEDs can be transferred by pick & place, laser lift-off or self-assembly. Among others, the self-assembly approach is a method that allows semiconductor light-emitting devices to find their positions on their own in a fluid, which is most advantageous in realizing large-screen display devices.

Recently, U.S. Pat. No. 9,825,202 disclosed a microLED structure suitable for self-assembly, but there is not enough research being carried out on technologies for manufacturing displays by the self-assembly of microLEDs.

DISCLOSURE OF INVENTION

Technical Problem

One aspect of the present disclosure is to provide a self-assembly device (apparatus) used in a self-assembly process for manufacturing a display device using microLEDs, and a self-assembly method using the same.

In particular, the present disclosure provides a self-assembly device used to transfer microLEDs to a large-area substrate, and a self-assembly method using the same.

Solution to Problem

To achieve those aspects and other advantages of the present disclosure, there is provided a device for self-assembling semiconductor light emitting diodes. The device may include an assembly chamber in which a fluid and the semiconductor light emitting diodes are accommodated, a magnetic chuck disposed above the assembly chamber and configured to apply magnetic force, while moving in a horizontal direction, to induce movement of the semiconductor light emitting diodes within the assembly chamber, a substrate chuck configured to dispose an assembly substrate, on which the semiconductor light emitting diodes inside the assembly chamber are to be seated, between the assembly chamber and the magnetic chuck and to support the assembly substrate, and a control part configured to control operations of the magnetic chuck and the substrate chuck, wherein the magnetic chuck may include a magnetic force forming part including a plurality of magnets, and a vacuum forming part configured to correct a bending (warpage) phenomenon of the assembly substrate by using vacuum pressure between the plurality of magnets so that a predetermined distance is maintained between one side of the magnetic chuck and the assembly substrate.

According to the present disclosure, the magnetic force forming part may include magnet accommodating portions arranged in a plurality of rows and columns and having spaces for accommodating some of the plurality of magnets, assembly magnets disposed in the magnet accommodating portions, and first cushion magnets disposed outside the magnet accommodating portions to be spaced apart from the assembly magnets, respectively.

According to the present disclosure, the magnet accommodating portion may include an opening at one side thereof adjacent to the assembly substrate, and a portion of the assembly magnet may be exposed through the opening.

According to the present disclosure, the magnetic force forming part may further include second cushion magnets each disposed between the first cushion magnet and the assembly magnet, and the second cushion magnets may be fixedly disposed on one surface inside the magnet accommodating portion.

According to the present disclosure, a repulsive force may act between the first cushion magnet and the second cushion magnet, and an attractive force may act between the second cushion magnet and the assembly magnet.

According to the present disclosure, the vacuum forming part may include vacuum holes disposed between the plurality of magnets and each having one side connected to a vacuum pump to apply vacuum pressure to the assembly substrate.

According to the present disclosure, the substrate chuck may include a power supply part for applying power to the assembly substrate so that an electric field is formed on one surface of the assembly substrate.

According to the present disclosure, the magnetic chuck may be disposed so that one side of the magnetic chuck and the assembly substrate have a gap of 2 mm or less, and the one side of the magnetic chuck may be one surface of the assembly magnet adjacent to the assembly substrate.

According to the present disclosure, the self-assembly device may further include a sensor unit disposed below the assembly chamber to monitor the inside of the assembly chamber.

A method for self-assembling semiconductor light-emitting diodes according to the present disclosure may include supplying the semiconductor light-emitting diodes into an assembly chamber containing a fluid, disposing on a top of the assembly chamber an assembly substrate including assembly electrodes and cells on which the semiconductor light emitting diodes are seated, disposing above the assembly substrate a magnetic chuck including a magnetic force forming part including a plurality of magnets and a vacuum forming part, and seating the semiconductor light-emitting diodes on the assembly substrate using a magnetic field and an electric field, wherein vacuum pressure may be continuously applied to the assembly substrate by the vacuum forming part while the step of seating the semiconductor light emitting diodes on the assembly substrate is in progress.

According to the present disclosure, the magnetic force forming part may include magnet accommodating portions arranged in a plurality of rows and columns and having spaces for accommodating some of the plurality of magnets, assembly magnets disposed in the magnet accommodating portions, and first cushion magnets disposed outside the magnet accommodating portions to be spaced apart from the assembly magnets, respectively.

According to the present disclosure, the magnetic force forming part may further include second cushion magnets each disposed between the first cushion magnet and the assembly magnet, and each of the second cushion magnets may be fixedly disposed on one surface inside the magnet accommodating portion.

According to the present disclosure, the arranging the magnetic chuck may be configured such that the assembly substrate and one surface of the assembly magnet adjacent to the assembly substrate have a gap of 2 mm or less.

According to the present disclosure, the seating the semiconductor light emitting diodes on the assembly substrate may be configured such that an electric field is formed as power is applied to the assembly electrodes.

According to the present disclosure, the seating the semiconductor light emitting diodes on the assembly substrate may include moving the magnetic chuck in a horizontal direction, and applying power to at least some of the assembly electrodes overlapping the assembly magnets.

According to the present disclosure, at least some of the assembly magnets may be further moved in a vertical direction during a process of moving the magnetic chuck in the horizontal direction.

Advantageous Effects of Invention

According to the present disclosure, a large amount of semiconductor light emitting diodes can be efficiently transferred to a large-area substrate. Specifically, according to the present disclosure, since a warpage or bending of a (large-area) substrate can be corrected and a distance between an assembly magnet and the substrate can be maintained within a predetermined distance during self-assembly, an assembly deviation within the substrate can be improved and high-speed transfer can be performed.

According to the present disclosure, since the substrate warped by gravity is pulled in an opposite direction of the gravity using vacuum pressure, a warpage of the substrate can be corrected without a damage on the substrate.

MODE FOR THE INVENTION

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings. Furthermore, it will be understood that when an element such as a layer, region or substrate is referred to as being "on" another element, it can be directly on the another element or an intermediate element may also be interposed therebetween.

A display device disclosed herein may include a portable (mobile) phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, the configuration according to the embodiment described herein can be applied as long as it can include a display even in a new product form to be developed later.

Figure 1:
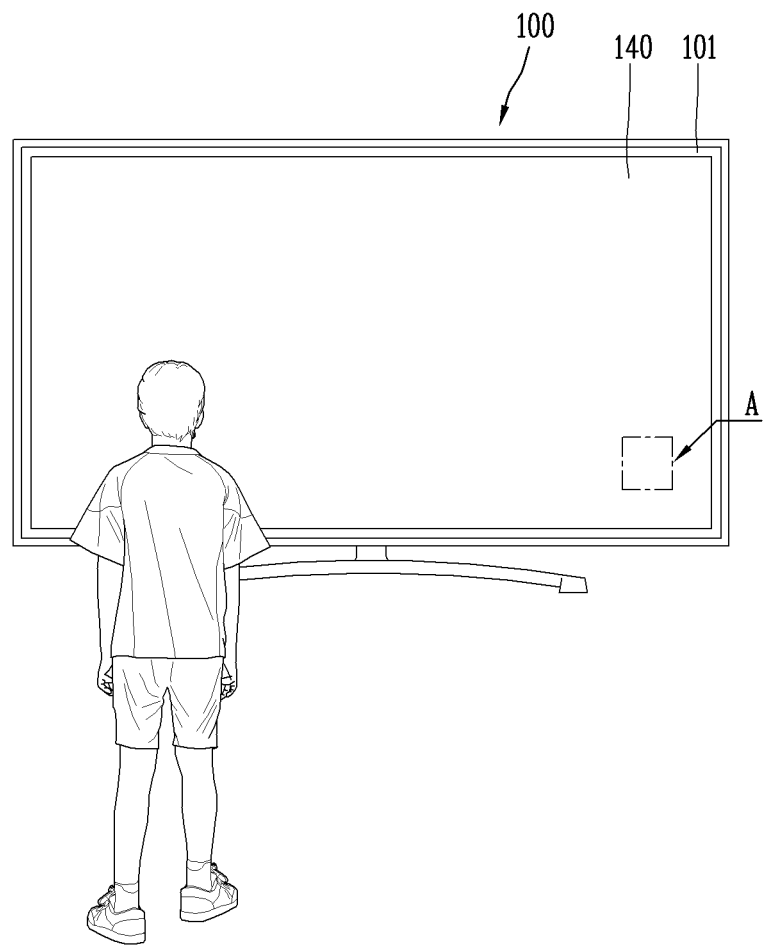
FIG. 1 is a conceptual view illustrating one embodiment of a display device using semiconductor light-emitting diodes.
Figure 2:
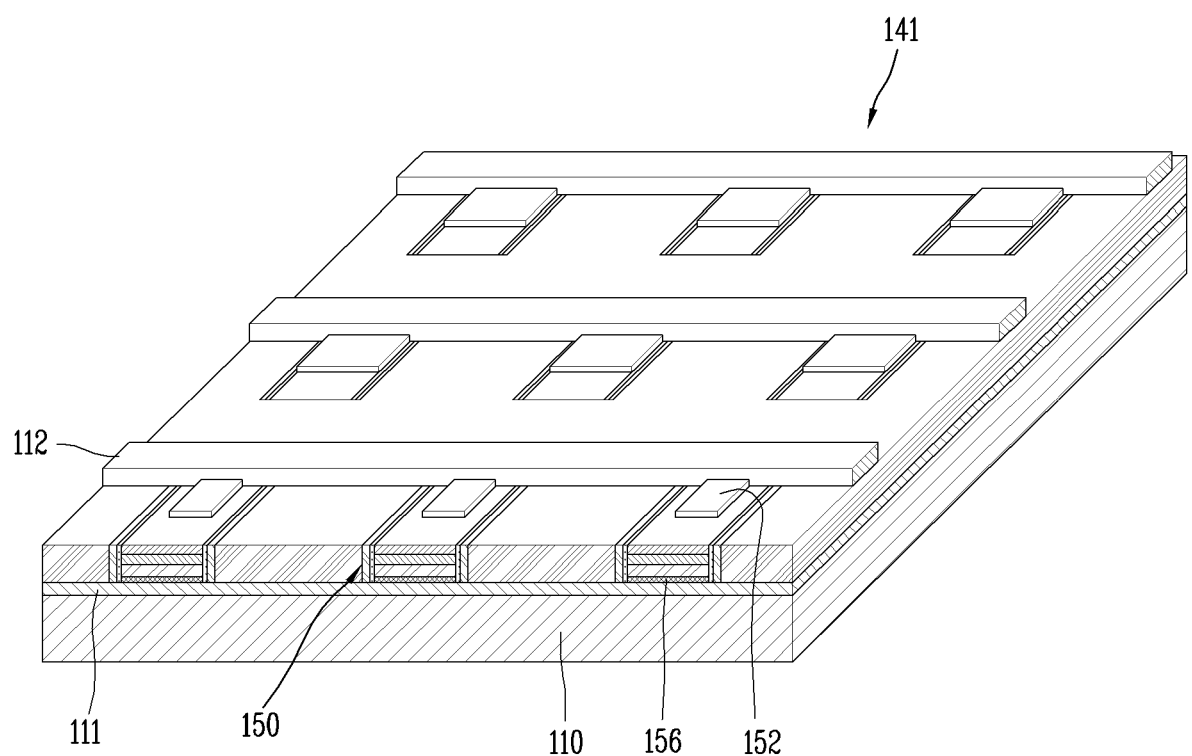
FIG. 2 is a partial enlarged view of a portion A in the display device of FIG. 1.
Figure 3:
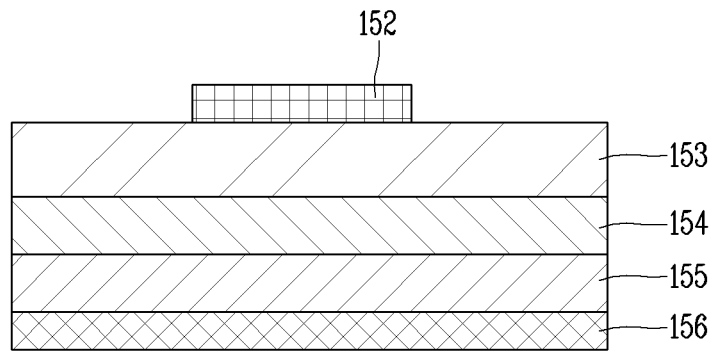
FIG. 3 is an enlarged view of the semiconductor light-emitting diode of FIG. 2.
Figure 4:
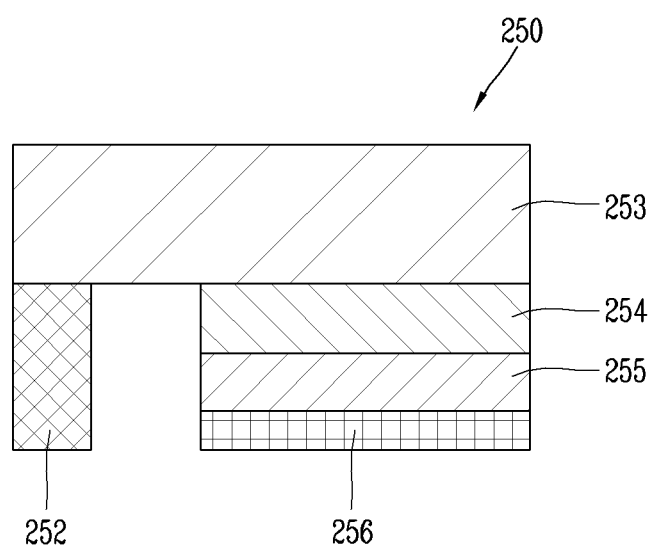
FIG. 4 is a view illustrating another embodiment of the semiconductor light-emitting diode of FIG. 2.

FIG. 1 is a conceptual view illustrating one embodiment of a display device using semiconductor light-emitting diodes, FIG. 2 is a partial enlarged view of a portion A in the display device of FIG. 1, FIG. 3 is an enlarged view of the semiconductor light-emitting diode of FIG. 2, and FIG. 4 is a view illustrating another embodiment of the semiconductor light-emitting diode of FIG. 2.

As illustrated, information processed by a controller of a display device 100 may be output on a display module 140. A closed loop-shaped case 101 that runs around the rim of the display module 140 may define the bezel of the display device 100.

The display module 140 may include a panel 141 that displays an image, and the panel 141 may include micro-sized semiconductor light-emitting diodes (or elements) 150 and a wiring substrate 110 where the semiconductor light-emitting diodes 150 are mounted.

The wiring substrate 110 may be provided with wirings, which can be connected to n-type electrodes 152 and p-type electrodes 156 of the semiconductor light-emitting diodes 150. As such, the semiconductor light-emitting diodes 150 may be provided on the wiring substrate 110 as individual pixels that emit light on their own.

The image displayed on the panel 141 may be visual information, which is rendered by controlling the light emission of unit pixels arranged in a matrix configuration independently through the wirings.

The present disclosure takes microLEDs (light-emitting diodes) as an example of the semiconductor light-emitting diodes 150 which convert current into light. The microLEDs may be light-emitting diodes that are small in size less than 100 µm. The semiconductor light-emitting diodes 150 may have light-emitting regions of red, green, and blue, and unit pixels may be produced by combinations of these colors. That is, the unit pixels are the smallest units for producing one color. Each unit pixel may contain at least three microLEDs.

More specifically, referring to FIG. 3, the semiconductor light-emitting diode 150 may have a vertical structure.

For example, each of the semiconductor light-emitting diodes 150 may be implemented with a high-power light emitting element that emits various lights including blue in which gallium nitride (GaN) is mostly used, and indium (In) and or aluminum (Al) are added thereto.

The vertical type semiconductor light-emitting diode includes a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 at the bottom may be electrically connected to a p-electrode 111 of the wiring substrate, and the upper n-type electrode 152 at the top may be electrically connected to an n-electrode 112 above the semiconductor light-emitting diode. The electrodes can be disposed in an upward/downward direction in the vertical semiconductor light-emitting diode 150, thereby providing a great advantage of reducing a chip size.

In another example, referring to FIG. 4, the semiconductor light-emitting diodes may be flip chip-type light-emitting diodes.

As an example of such a flip chip-type light-emitting diode, the semiconductor light-emitting diode 250 may include a p-type electrode 256, a p-type semiconductor layer 255 disposed on the p-type layer 256, an active layer 254 disposed on the p-type semiconductor layer 255, an n-type semiconductor layer 253 disposed on the active layer 254, and an n-type electrode 252 vertically separated from the p-type electrode 256 on the n-type semiconductor layer 253. In this case, both the p-type electrode 256 and the n-type electrode 252 may be electrically connected to a p electrode and an n electrode of the wiring substrate, below the semiconductor light-emitting diode 250.

The vertical semiconductor light-emitting diode and a flip-type light-emitting diode each may be used as a green semiconductor light-emitting diode, blue semiconductor light-emitting diode, or red semiconductor light-emitting diode. The green semiconductor light-emitting diode and the blue semiconductor light-emitting diode may be implemented as high-power light-emitting diodes that are composed mostly of gallium nitride (GaN), with some indium (In) and/or aluminum (Al) added to it, and emit green and blue light, respectively. As an example, the semiconductor light-emitting diodes may be made of gallium nitride thin films which include various layers of n-Gan, p-GaN, AlGaN, InGaN, etc. More specifically, the P-type semiconductor layer may be P-type GaN, and the N-type semiconductor layer may be N-type GaN. However, for the red semiconductor light-emitting diode, the P-type semiconductor layer may be P-type GaAs, and the N-type semiconductor layer may be N-type GaAs.

Moreover, the p-type semiconductor layer may be P-type GaN doped with Mg on the p electrode, and the n-type semiconductor layer may be N-type GaN doped with Si on the n electrode. In this case, the above-described semiconductor light-emitting diodes may be semiconductor light-emitting diodes without the active layer.

In some examples, referring to FIGS. 1 to 4, because of the very small size of the light-emitting diodes, self-emissive, high-definition unit pixels may be arranged on the display panel, and therefore the display device can deliver high picture quality.

In the display device using the semiconductor light-emitting diodes, semiconductor light-emitting diodes may be grown on a wafer, formed through mesa and isolation, and used as individual pixels. The micro-sized semiconductor light-emitting diodes 150 should be transferred onto preset positions on a substrate of the display panel. One of the transfer technologies available may be pick & place, but it has a very low success rate and requires a lot of time. In another example, a number of diodes may be transferred at a time by using a stamp or roll, which, however, is not suitable for large-screen displays because of limited yields. The present disclosure proposes a new method and device for manufacturing a display device that can solve these problems.

To this end, a new method for manufacturing a display device will be described first below. FIGS. 5A to 5E are conceptual diagrams illustrating a new process for manufacturing a semiconductor light-emitting diode.

In this specification, a display device using passive matrix (PM) type semiconductor light-emitting diodes will be illustrated. However, an example described below may also be applicable to a display device using an active matrix (AM) type semiconductor light-emitting diode. In addition, the self-assembly method described in this specification can be applied to both horizontal semiconductor light-emitting diodes and vertical semiconductor light-emitting diodes.

Figure 5A:
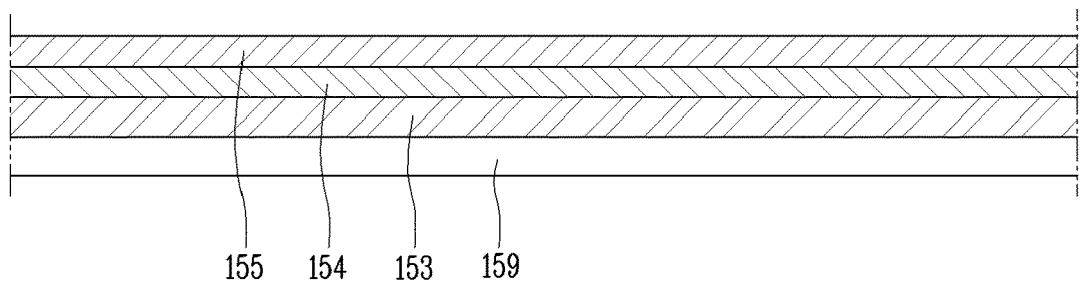
FIGS. 5A to 5E are conceptual diagrams illustrating a new process for manufacturing a semiconductor light-emitting diode.

First of all, according to the manufacturing method of the display device, a first conductive semiconductor layer 153, an active layer 154, and a second conductive semiconductor layer 155 are grown on a growth substrate 159 (FIG. 5A).

Once the first conductive semiconductor layer 153 is grown, then the active layer 154 is grown on the first conductive semiconductor layer 153, and then the second conductive semiconductor layer 155 is grown on the active layer 154. By sequentially growing the first conductive semiconductor layer 153, the active layer 154, and the second conductive semiconductor layer 155, the first conductive semiconductor layer 153, the active layer 154, and the second conductive semiconductor layer 155 may form a stack structure as illustrated in FIG. 5A.

In this case, the first conductive semiconductor layer 153 may be a n-type semiconductor layer, and the second conductive semiconductor layer 155 may be a p-type semiconductor layer. However, the present disclosure is not necessarily limited to this, and the first conductive type may be p-type and the second conductive type may be n-type.

Moreover, although this exemplary embodiment is illustrated by assuming the presence of the active layer, the active layer may be omitted if necessary, as stated above. In such an example, the p-type semiconductor layer may be p-type GaN doped with Mg on the p electrode, and the n-type semiconductor layer may be n-type GaN doped with Si on the n electrode.

The growth substrate 159 (wafer) may be formed of, but not limited to, light-transmissive material, for example, one of sapphire (Al2O3), GaN, ZnO, and AlO. Also, the growth substrate 159 may be made of a material suitable for growing semiconductor materials, namely, a carrier wafer. The growth substrate 159 may be formed of a high thermal conducting material, and may be a conductive substrate or insulating substrate, for example, may use at least one of SiC, Si, GaAs, GaP, InP, and Ga2O3 substrates which have higher thermal conductivity than sapphire (Al2O3) substrates.

Figure 5B:
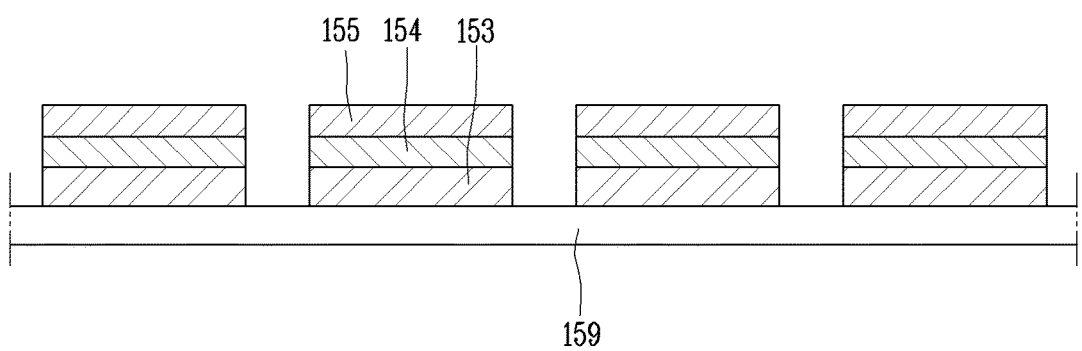

Next, a plurality of semiconductor light-emitting diodes may be formed by removing at least parts of the first conductive semiconductor layer 153, the active layer 154, and the second conductive semiconductor layer 155 (FIG. 5B).

More specifically, isolation may be performed so that the plurality of light-emitting diodes form a light-emitting diode array. That is, a plurality of semiconductor light-emitting diodes may be formed by vertically etching the first conductive semiconductor layer 153, the active layer 154, and the second conductive semiconductor layer 155.

In the case of horizontal semiconductor light-emitting diodes, a mesa process may be performed which exposes the first conductive semiconductor layer 153 to the outside by vertically removing part of the active layer 154 and the second conductive semiconductor layer 155, and then isolation may be performed which forms an array of semiconductor light-emitting diodes by etching the first conductive semiconductor layer 153.

Figure 5C:
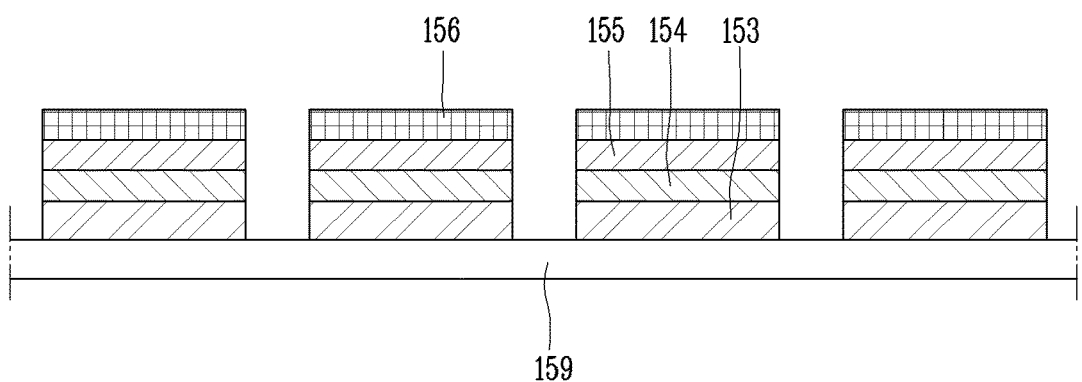

Next, a second conductive electrode 156 (or p-type electrode) may be formed on one surface of the second conductive semiconductor layer 155 (FIG. 5C). The second conductive electrode 156 may be formed by a deposition method such as sputtering, but the present disclosure is not necessarily limited to this. In a case where the first conductive semiconductor layer and the second conductive semiconductor layer are an n-type semiconductor layer and a p-type semiconductor layer, respectively, the second conductive electrode 156 may serve as an n-type electrode.

Figure 5D:
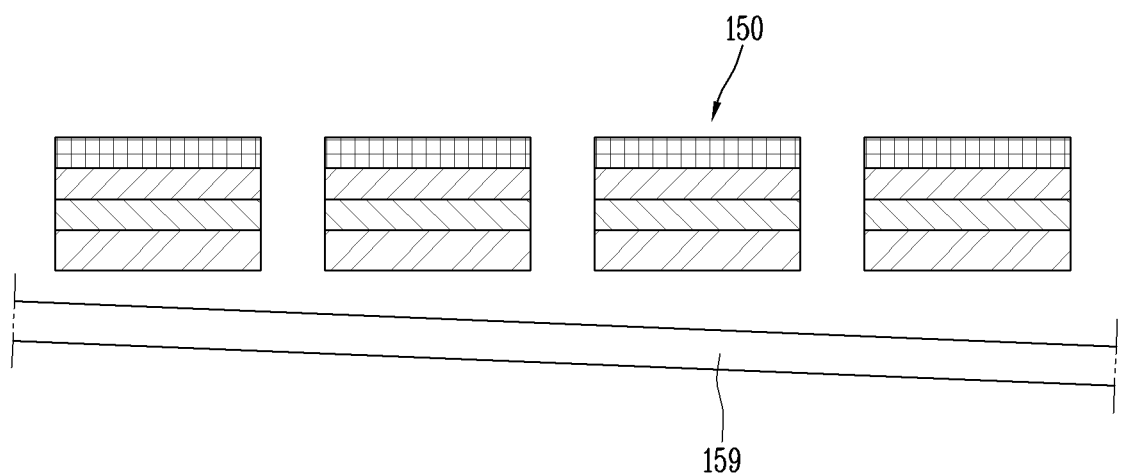

Next, the growth substrate 159 may be removed, thus leaving a plurality of semiconductor light-emitting diodes. For example, the growth substrate 159 may be removed using laser lift-off (LLO) or chemical lift-off (CLO) (FIG. 5D).

Figure 5E:
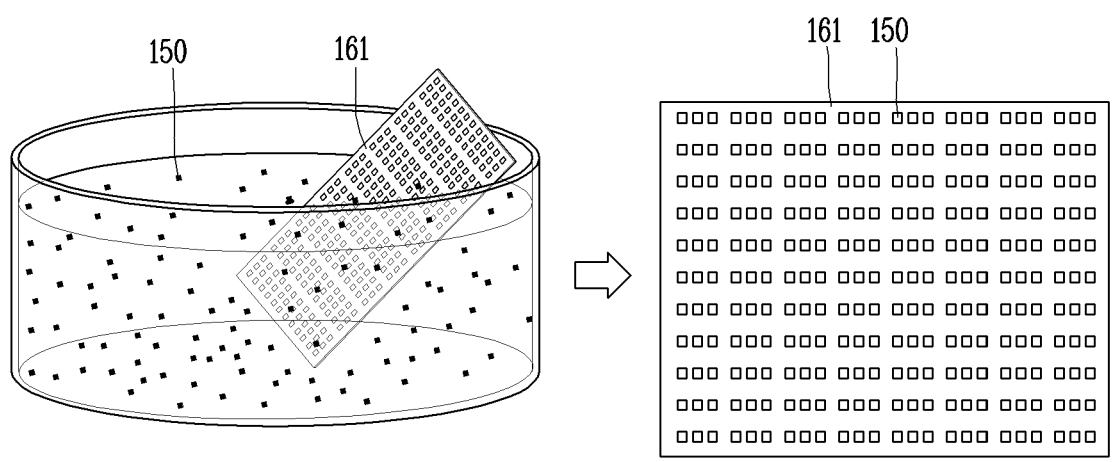

Afterwards, the step of mounting the semiconductor light-emitting diodes 150 on a substrate in a chamber filled with a fluid may be performed (FIG. 5E).

For example, the semiconductor light-emitting diodes 150 and the substrate 161 may be put into a chamber filled with a fluid, and the semiconductor light-emitting diodes may be self-assembled onto the substrate 161 using fluidity, gravity, surface tension, etc. In this case, the substrate may be an assembly substrate 161.

In another example, a wiring substrate, instead of the assembly substrate 161, may be put into a fluid chamber, and the semiconductor light-emitting diodes 150 may be mounted directly onto the wiring substrate. In this case, the substrate may be a wiring substrate. For convenience of explanation, the present disclosure is illustrated with an example in which the semiconductor light-emitting diodes 150 are mounted onto the assembly substrate 161.

To facilitate the mounting of the semiconductor light-emitting diodes 150 onto the assembly substrate 161, cells (not illustrated) into which the semiconductor light-emitting diodes 150 are fitted may be provided on the assembly substrate 161. Specifically, cells where the semiconductor light-emitting diodes 150 are mounted may be disposed on the assembly substrate 161 at positions where the semiconductor light-emitting diodes 150 are aligned with wiring electrodes. The semiconductor light-emitting diodes 150 may be assembled to the cells as they move within the fluid.

After arraying the semiconductor light-emitting diodes 150 on the assembly substrate 161, the semiconductor light-emitting diodes 150 may be transferred to the wiring substrate from the assembly substrate 161, thereby enabling a large-area transfer across a large area. Thus, the assembly substrate 161 may be referred to as a temporary substrate.

Meanwhile, the above-explained self-assembly method requires a higher transfer yield so that it can be applied to the manufacture of large-screen displays. The present disclosure proposes a method and device that minimizes the effects of gravity or friction and avoids non-specific binding, in order to increase the transfer yield.

In this case, in the display device according to the present disclosure, a magnetic material may be placed on the semiconductor light-emitting diodes so that the semiconductor light-emitting diodes are moved by magnetic force, and the semiconductor light-emitting diodes may be mounted at preset positions by an electric field in the process of being moved. This transfer method and device will be described in more detail below with reference to the accompanying drawings.

Figure 6:
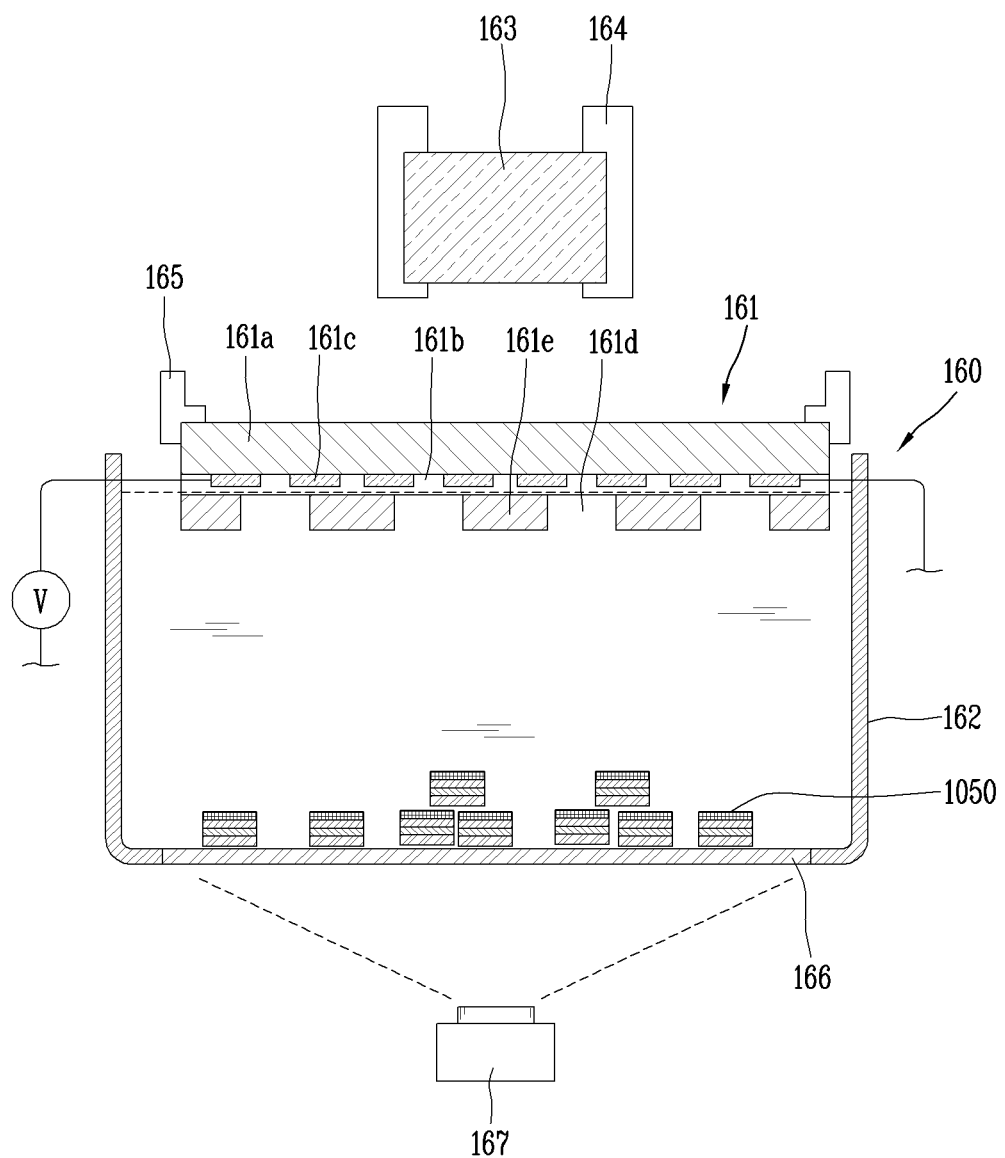
FIG. 6 is a conceptual diagram illustrating one embodiment of a device for self-assembling semiconductor light-emitting diodes according to the present disclosure.
Figure 7:
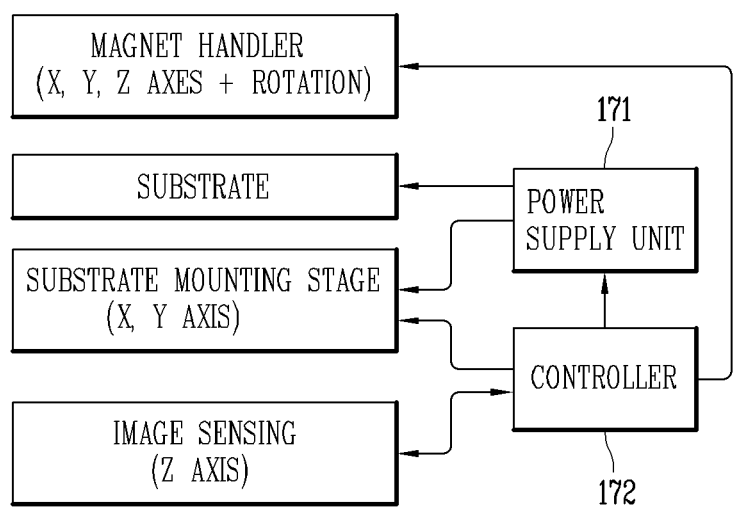
FIG. 7 is a block diagram of the self-assembly device of FIG. 6.

FIG. 6 is a conceptual diagram illustrating an example of a device for self-assembling semiconductor light-emitting diodes and FIG. 7 is a block diagram of the self-assembly device of FIG. 6. FIGS. 8A to 8E are conceptual view illustrating a process for self-assembling semiconductor light-emitting diodes using the self-assembly device of FIG. 6 and FIG. 9 is a conceptual view illustrating the semiconductor light-emitting diode of FIGS. 8A to 8E.

Referring to FIGS. 6 and 7, the self-assembly device 160 may include a fluid chamber 162, a magnet 163, and a position controller 164.

The fluid chamber 162 may define a space for receiving a plurality of semiconductor light-emitting diodes. The space may be filled with a fluid, and the fluid may be an assembly solution, which includes water or the like. Thus, the fluid chamber 162 may be a water tank and configured as an open-type. However, the present disclosure is not limited to this, and the fluid chamber 162 may be a closed-type chamber in which the space is in a closed state.

A substrate 161 may be placed in the fluid chamber 162 so that an assembly surface where the semiconductor light-emitting diodes 150 are assembled faces downwards. For example, the substrate 161 may be fed to an assembly site by a feed unit (transfer unit), and the transfer unit may include a stage 165 where the substrate is mounted. The position of the stage 165 may be adjusted by the controller, whereby the substrate 161 can be fed to the assembly site.

In this instance, the assembly surface of the substrate 161 at the assembly site may face the bottom of the fluid chamber 162. As illustrated in the drawings, the assembly surface of the substrate 161 may be placed to be soaked with the fluid in the fluid chamber 162. Thus, the semiconductor light-emitting diodes 150 in the fluid may be moved to the assembly surface.

The substrate 161 may be an assembly substrate where an electric field can be formed, and may include a base portion 161a, a dielectric layer 161b, and a plurality of electrodes 161c.

The base portion 161a may be made of an insulating material, and the plurality of electrodes 161c may be thin-film or thick-film bi-planar electrodes that are patterned on one surface of the base portion 161a. The electrodes 161c may be formed of a stack of Ti/Cu/Ti, Ag paste, ITO, etc.

The dielectric layer 161b may be made of an inorganic material such as $SiO_2$, $SiN_x$, SION, $Al_2O_3$, $TiO_2$, $HfO_2$, etc. Alternatively, the dielectric layer 161b may be an organic insulator and configured as a single layer or a multi-layer. The thickness of the dielectric layer 161b may range from several tens of nm to several µm.

Further, the substrate 161 according to the present disclosure includes a plurality of cells 161d that are separated by barrier walls. The cells 161d may be sequentially arranged in one direction and made of a polymer material. Furthermore, the barrier walls 161e defining the cells 161d may be made to be shared with neighboring cells 161d. The barrier walls 161e may protrude from the base portion 161a, and the cells 161d may be sequentially arranged in one direction by the barrier walls 161e. More specifically, the cells 161d may be sequentially arranged in column and row directions and have a matrix configuration.

As illustrated in the drawings, the cells 161d may have recesses for receiving the semiconductor light-emitting diodes 150, and the recesses may be spaces defined by the barrier walls 161e. The recesses may have a shape identical or similar to the shape of the semiconductor light-emitting diodes. For example, if the semiconductor light-emitting diodes are rectangular, the recesses may be rectangular too. Moreover, although illustrated, the recesses formed in the cells may be circular if the semiconductor light-emitting diodes are circular. Moreover, each of the cells is configured to accommodate a single semiconductor light-emitting diode. In other words, a single semiconductor light-emitting diode is accommodated in a single cell.

Meanwhile, the plurality of electrodes 161c may have a plurality of electrode lines that are placed on bottoms of the cells 161d, and the plurality of electrode lines may extend to neighboring cells.

The plurality of electrodes 161c may be placed beneath the cells 161d, and different polarities may be applied to create an electric field within the cells 161d. To form an electric field, the dielectric layer 161b may form the bottom of the cells 161d while covering the electrodes 161c. With this structure, when different polarities are applied to a pair of electrodes 161c beneath each cell 161d, an electric field may be formed and the semiconductor light-emitting diodes can be inserted into the cells 161d by the electric field.

The electrodes of the substrate 161 at the assembly site may be electrically connected to a power supply 171. The power supply unit 171 may perform the function of generating the electric field by applying power to the electrodes.

As shown in the drawings, the self-assembly device may have the magnet 163 for applying magnetic force to the semiconductor light-emitting diodes. The magnet 163 may be disposed at a distance from the fluid chamber 162 to apply magnetic force to the semiconductor light-emitting diodes 150. The magnet 163 may be disposed to face an opposite side of the assembly surface of the substrate 161, and the position of the magnet 163 may be controlled by the position controller 164 connected to the magnet 163.

The semiconductor light-emitting diodes 1050 may have a magnetic material so that they can be moved within the fluid by a magnetic field.

Referring to FIG. 9, a semiconductor light-emitting diode having a magnetic material may include a first conductive electrode 1052, a second conductive electrode 1056, a first conductive semiconductor layer 1053 on which the first conductive electrode 1052 is disposed, a second conductive semiconductor layer 1055 which overlaps the first conductive semiconductor layer 1052 and on which the second conductive electrode 1056 is disposed, and an active layer 1054 disposed between the first and second conductive semiconductor layers 1053 and 1055.

Here, the first conductive may refer to p-type, and the second conductive type may refer to n-type, or vice versa. As stated previously, the semiconductor light-emitting diode may be formed without the active layer.

Meanwhile, the first conductive electrode 1052 may be formed after the semiconductor light-emitting diode is assembled onto the wiring substrate by the self-assembling of the semiconductor light-emitting diode. Further, the second conductive electrode 1056 may include a magnetic material. The magnetic material may refer a magnetic metal. The magnetic material may be Ni, SmCo, etc. In another example, the magnetic material may include at least one of Gd-based, La-based, and Mn-based materials.

The magnetic material may be provided in the form of particles on the second conductive electrode 1056. Alternatively, one layer of a conductive electrode including a magnetic material may be made of the magnetic material. As an example, the second conductive electrode 1056 of the semiconductor light-emitting diode 1050 may include a first layer 1056a and a second layer 1056b, as illustrated in FIG. 9. Here, the first layer 1056a may include a magnetic material, and the second layer 1056b may include a metal material other than the magnetic material.

As illustrated in the drawing, in this example, the first layer 1056a including the magnetic material may be disposed in contact with the second conductive semiconductor layer 1055. In this case, the first layer 1056a may be disposed between the second layer 1056b and the second conductive semiconductor layer 1055. The second layer 1056b may be a contact metal that is connected to the second electrode on the wiring substrate. However, the present disclosure is not necessarily limited to this, and the magnetic material may be disposed on one surface of the first conductive semiconductor layer.

Still referring to FIGS. 6 and 7, more specifically, on top of the fluid chamber of the self-assembly device, a magnet handler capable of automatically or manually moving the magnet 163 on the x, y, and z axes or a motor capable of rotating the magnet 163 may be provided. The magnet handler and motor may constitute the position controller 164. As such, the magnet 163 may rotate in a horizontal, clockwise, or counterclockwise direction with respect to the substrate 161.

Meanwhile, the fluid chamber 162 may be provided with a light-transmissive bottom plate 166, and the semiconductor light-emitting diodes may be disposed between the bottom plate 166 and the substrate 161. An image sensor 167 may be disposed to face the bottom plate 166 so as to monitor the inside of the fluid chamber 162 through the bottom plate 166. The image sensor 167 may be controlled by a controller 172, and may include an inverted-type lens, CCD, etc. so as to observe the assembly surface of the substrate 161.

The self-assembly device may be configured to use a magnetic field and an electric field in combination. With this, the semiconductor light-emitting diodes can be mounted at preset positions on the substrate by the electric field while being moved by changes in the position of the magnet. Hereinafter, the assembly process using the self-assembly device will be described in more detail.

First of all, a plurality of semiconductor light-emitting diodes 1050 having a magnetic material may be formed through the process explained with reference to FIGS. 5A to 5C. In this case, the magnetic material may be deposited onto the semiconductor light-emitting diodes in the process of forming the second conductive electrode of FIG. 5C.

Figure 8A:
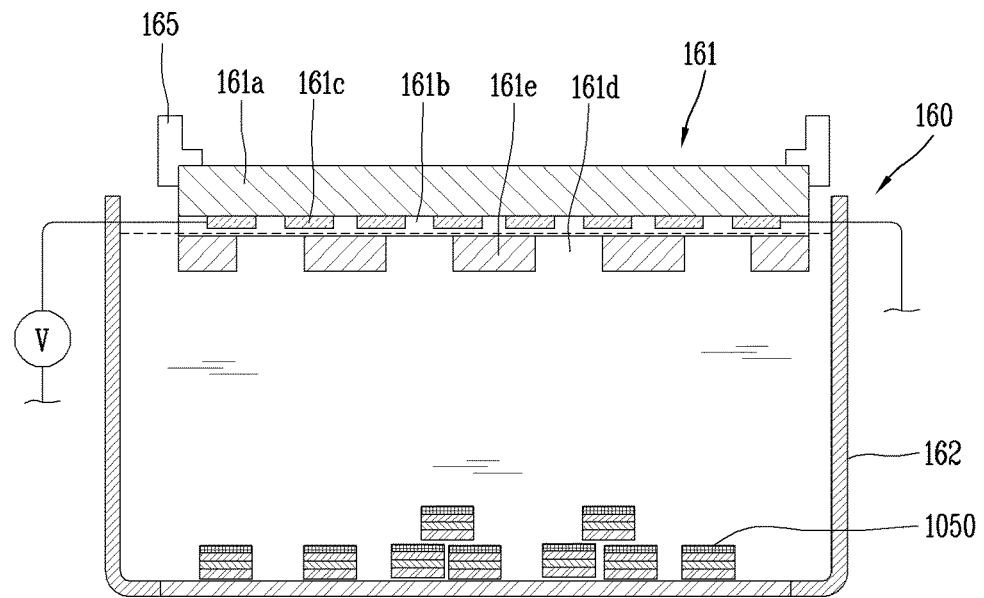
FIGS. 8A to 8E are conceptual views illustrating a process for self-assembling semiconductor light-emitting diodes using the self-assembly device of FIG. 6.
Figure 9:
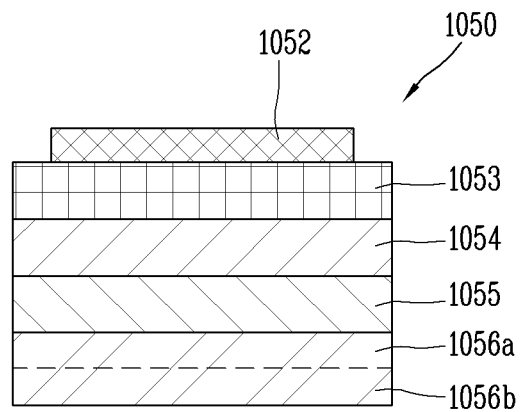
FIG. 9 is a view illustrating one embodiment of a semiconductor light-emitting diode that is used in the self-assembly process of FIGS. 8A to 8E.

Next, the substrate 161 may be fed to an assembly site, and the semiconductor light-emitting diodes 1050 may be put into the fluid chamber 162 (FIG. 8A).

As described above, the assembly site on the substrate 161 may be a position at which the substrate 161 is placed in the fluid chamber 162 in such a way that an assembly surface where the semiconductor light-emitting diodes 150 are assembled faces downwards.

In this case, some of the semiconductor light-emitting diodes 1050 may sink to the bottom of the fluid chamber 162 and some of them may float in the fluid. When the fluid chamber 162 is provided with the light-transmissive bottom plate 166, some of the semiconductor light-emitting diodes 1050 may sink to the bottom plate 166.

Figure 8B:
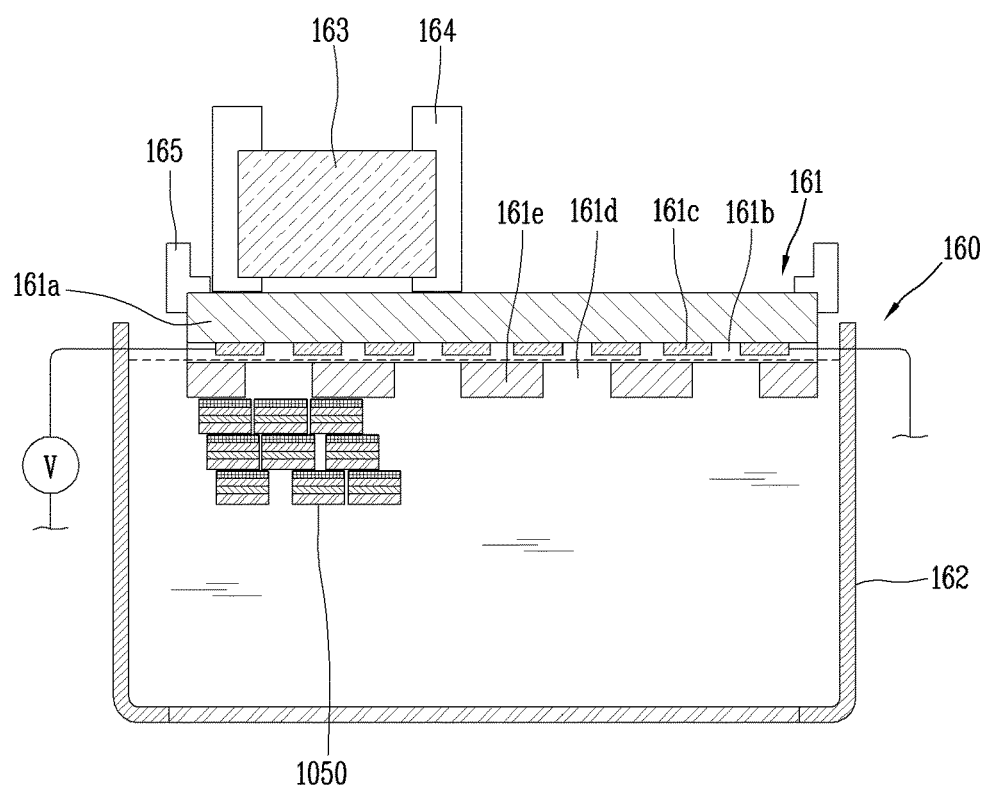

Next, magnetic force may be applied to the semiconductor light-emitting diodes 1050 so that the semiconductor light-emitting diodes 1050 in the fluid chamber 162 come up to the surface (FIG. 8B).

When the magnet 163 of the self-assembly device moves to the opposite side of the assembly surface of the substrate 161 from its original position, the semiconductor light-emitting diodes 1050 may float in the fluid towards the substrate 161. The original position may refer to s position at which the magnet 163 is outside the fluid chamber 162. As another example, the magnet 163 may be configured as an electromagnet. In this case, an initial magnetic force may be generated by supplying electricity to the electromagnet.

Meanwhile, in this implementation, the spacing between the assembly surface of the substrate 161 and the semiconductor light-emitting diodes 1050 may be controlled by adjusting strength of the magnetic force. For example, the spacing may be controlled by using weight, buoyancy, and magnetic force of the semiconductor light-emitting diodes 1050. The spacing may be several millimeters to several tens of micrometers from the outermost part of the substrate 161.

Figure 8C:
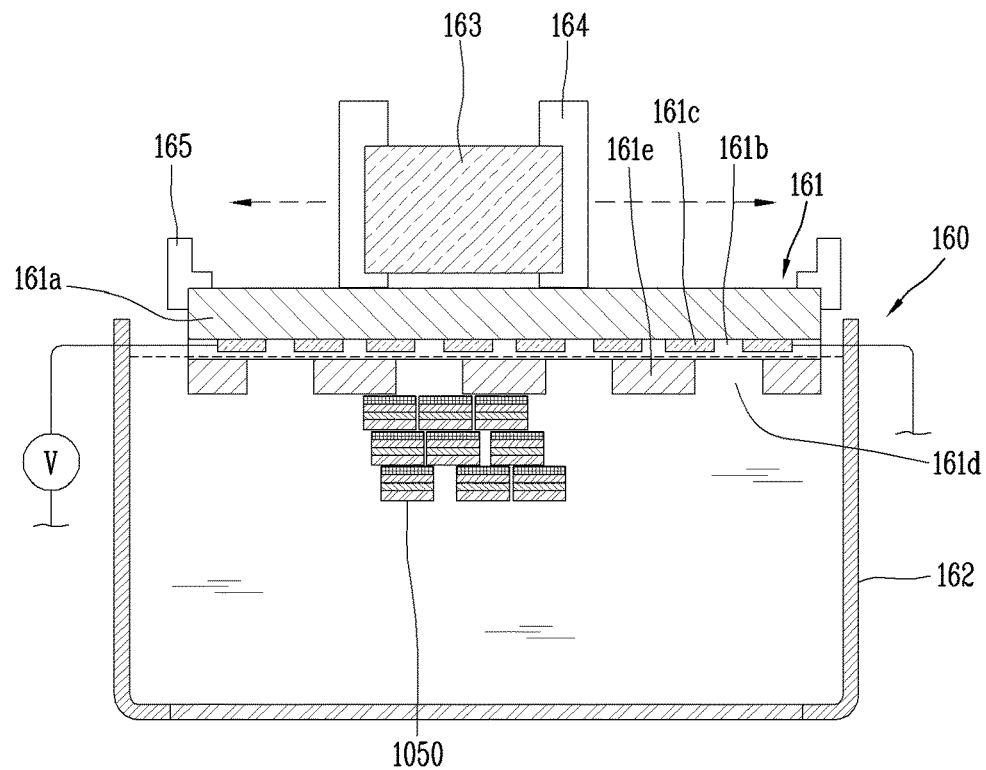

Next, magnetic force may be applied to the semiconductor light-emitting diodes 1050 so that the semiconductor light-emitting diodes 1050 can move in one direction within the fluid chamber 162. For example, the magnet 163 may move in a horizontal direction to the substrate, a clockwise direction, or a counterclockwise direction (FIG. 8C). In this case, the semiconductor light-emitting diodes 1050 may be moved horizontally with respect to the substrate 161 by the magnetic force, with being spaced apart from the substrate 161.

Next, the semiconductor light-emitting diodes 1050 may be guided to preset positions on the substrate 161 by applying an electric field so that the semiconductor light-emitting diodes 1050 are mounted at the preset positions during their movement (FIG. 8C). For example, the semiconductor light-emitting diodes 1050 may be moved vertically with respect to the substrate 161 by the electric field while being moved horizontally with respect to the substrate 161, thereby being placed at the preset positions of the substrate 161.

More specifically, an electric field may be generated by supplying power to bi-planar electrodes on the substrate 161, and the semiconductor light-emitting electrodes 1050 may be guided to be assembled only at the preset positions by the electric field. That is, the semiconductor light-emitting diodes 1050 may be self-assembled at the assembly site on the substrate 161 by a selectively generated electric field. To this end, the substrate 161 may be provided with cells into which the semiconductor light-emitting diodes 1050 are fitted.

Afterwards, unloading of the substrate 161 may be performed, thereby completing the assembly process. In a case where the substrate 161 is an assembly substrate, the assembled semiconductor light-emitting diodes may be transferred onto a wiring substrate to carry out a subsequent process for realizing the display device, as described previously.

Figure 8D:
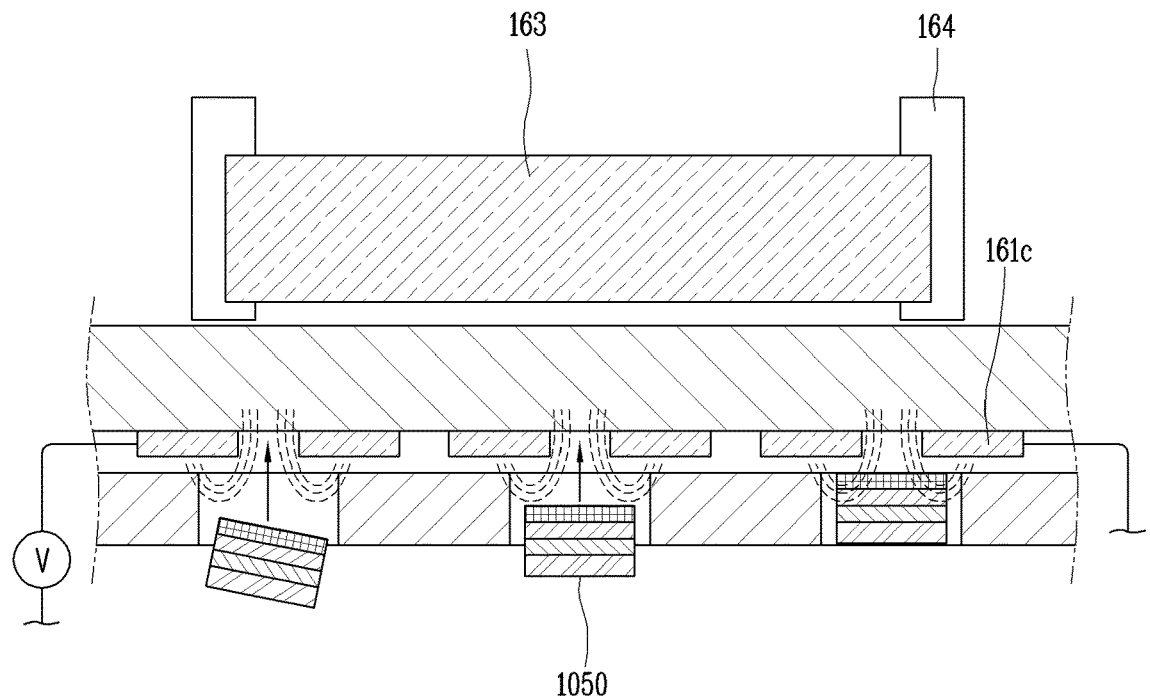
Figure 8E:
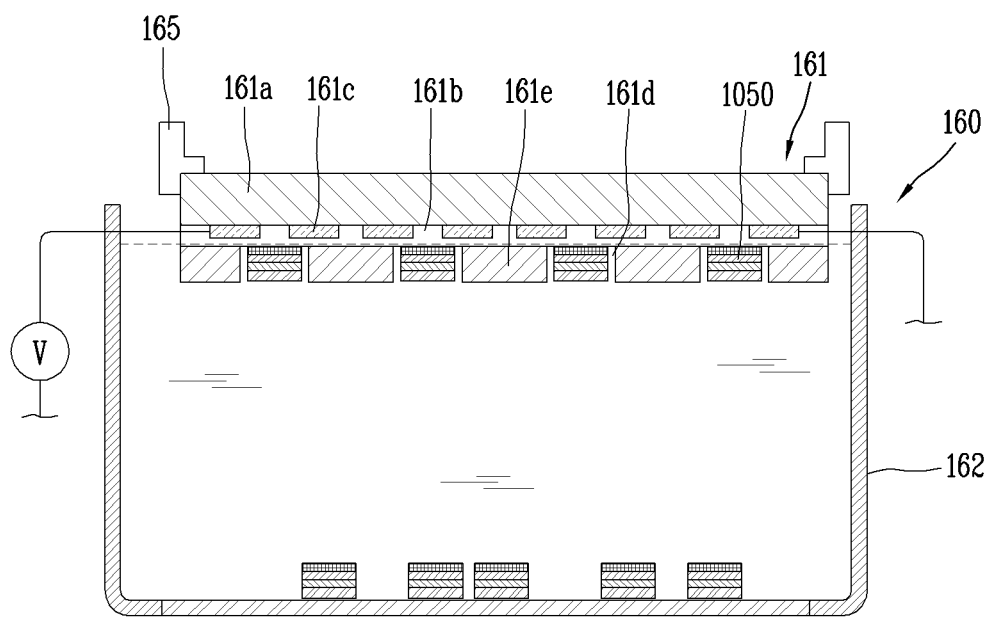

Meanwhile, after the semiconductor light-emitting diodes 1050 are guided to the preset positions, the magnet 163 may be moved away from the substrate 161 such that the semiconductor light-emitting diodes 1050 remaining in the fluid chamber 162 fall to the bottom of the fluid chamber 162 (FIG. 8D). In another example, when power supply is stopped in a case where the magnet 163 is an electromagnet, the semiconductor light-emitting diodes 1050 remaining in the fluid chamber 162 may fall to the bottom of the fluid chamber 162.

Thereafter, the semiconductor light-emitting diodes 1050 on the bottom of the fluid chamber 162 may be collected, and the collected semiconductor light-emitting diodes 1050 may be re-used.

In the above-explained self-assembly device and method, parts at far distances may be concentrated near a preset assembly site by using a magnetic field in order to increase assembly yields in a fluidic assembly, and guided to be selectively assembled only at the assembly site by applying an electric field to the assembly site. In this case, the assembly substrate may be positioned on top of a water tank, with its assembly surface facing downward, thereby minimizing the effect of gravity from the weights of the parts and avoiding non-specific binding and eliminating defects. That is, the assembly substrate may be placed on the top to increase transfer yields, thus minimizing the effect of gravity or friction and avoiding non-specific binding.

As seen from above, with the configuration, a large number of semiconductor light-emitting diodes can be assembled at a time in a display device where individual pixels are made up of semiconductor light-emitting diodes.

As such, a large number of semiconductor light-emitting diodes can be pixelated on a small-sized wafer and then transferred onto a large-area substrate. This enables the manufacture of a large-area display device at a low cost.

Meanwhile, when performing the self-assembly process described above, several problems may occur. The biggest problem is a bending (warpage) phenomenon of the substrate 161 occurred at a central portion of the substrate 161 on which the semiconductor light emitting diodes are placed.

Figure 10:
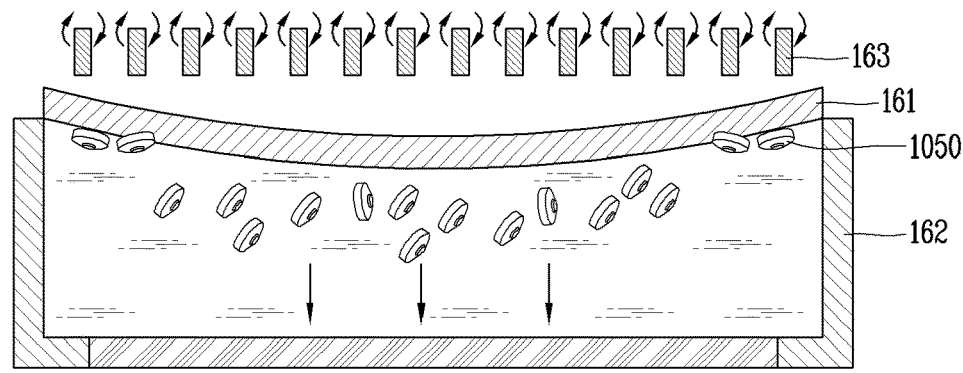
FIG. 10 is a view illustrating a warpage (or bending) phenomenon of a substrate that occurs during self-assembly.

FIG. 10 is a view illustrating a warpage phenomenon of a substrate that occurs during self-assembly.

As illustrated in FIG. 10, the substrate 161 is warped (bent) toward the bottom surface of the assembly chamber 162 by gravity acting on the substrate 161, and in particular, the warpage becomes much worse as being away from edges supported by other equipment. This phenomenon becomes much worse as the area of the substrate 161 increases.

The warpage of the substrate 161 is a factor that hinders the self-assembly process. Specifically, magnets 163 for applying magnetic force to the semiconductor light emitting diodes 1050 are disposed above the substrate 161. At this time, in order for the magnetic force formed by the magnets 163 to act on the semiconductor light emitting diodes 1050 inside the assembly chamber 162 with the substrate 161 interposed therebetween, a predetermined distance should be maintained between the magnets 163 and the substrate 161. However, due to the warpage of the substrate 161, a specific region within the substrate 161, particularly, the central portion of the substrate 161, is spaced apart from the magnets 163 by more than the predetermined distance. This makes it impossible that the magnetic force reaches the semiconductor light emitting diodes 1050. This also lowers an assembly rate of the semiconductor light emitting diodes 1050.

The present disclosure relates to a self-assembly device for semiconductor light emitting diodes (hereinafter, referred to as a self-assembly device or apparatus) capable of solving a warpage of a substrate and maintaining a predetermined distance between magnets and the substrate, and a self-assembly method using the same (hereinafter, referred to as a self-assembly method).

Figure 11:
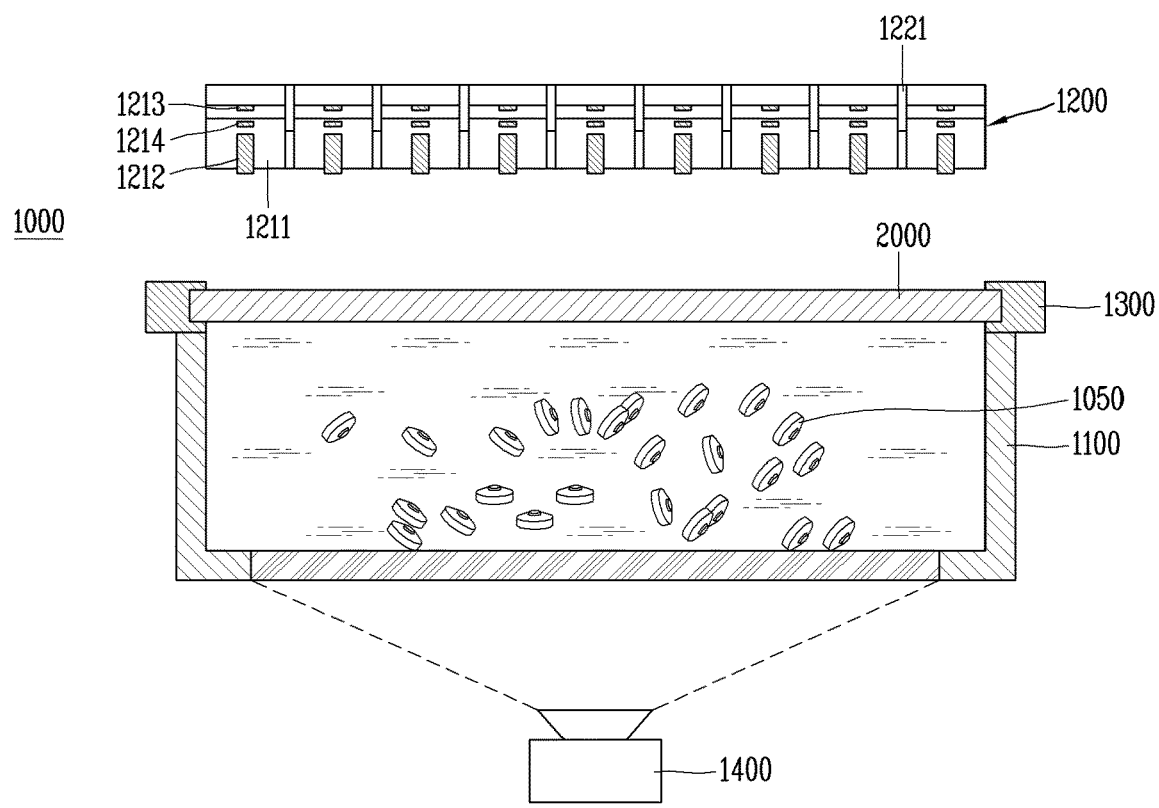
FIG. 11 is a conceptual view illustrating one embodiment of a device for self-assembling semiconductor light-emitting diodes.
Figure 12:
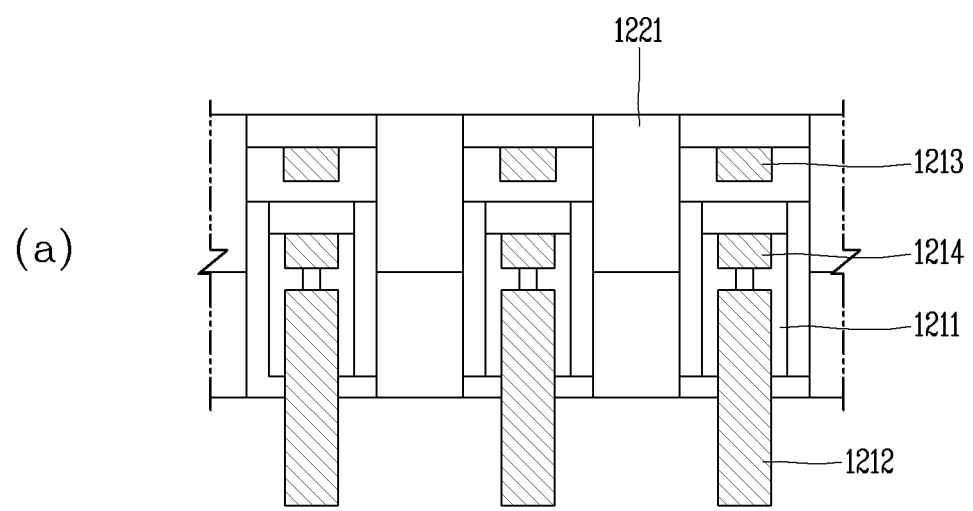
FIG. 12 is a conceptual view illustrating an embodiment of structure and operation of a magnetic force generating part in accordance with the present disclosure.
Figure 12:
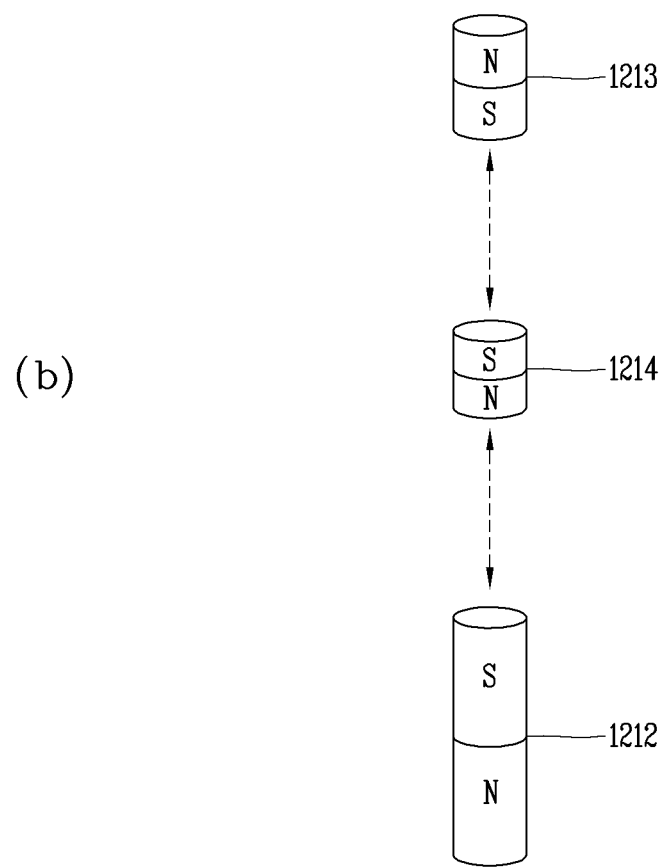

FIG. 11 is a conceptual view illustrating one embodiment of an apparatus (or device) for self-assembling semiconductor light-emitting diodes, and FIG. 12 is a conceptual view illustrating an embodiment of structure and operation of a magnetic force generating part in accordance with the present disclosure.

A self-assembly device 1000 according to the present disclosure may include an assembly chamber 1100, a magnetic chuck 1200, a substrate chuck 1300, and a control part (not illustrated).

The assembly chamber 1100 may have a space in which a fluid and semiconductor light-emitting diodes 1050 are accommodated. In one embodiment, the assembly chamber 1100 may have a shape like a water tank with one side open, but is not limited thereto.

The fluid accommodated in the assembly chamber 1100 is an assembly solution and may be water, preferably, DI (de-ionized) water, but is not limited thereto. In addition, although the present disclosure and drawings describe and illustrate that the semiconductor light emitting diodes 1050 illustrated in FIG. 9 are accommodated in the assembly chamber 1100, any semiconductor light emitting diode may be used if it has a self-assembling structure. The self-assembling structure may refer to a symmetrical structure or an asymmetrical structure having position selectivity and also a structure including a magnetic substance so as to be induced by magnetic force.

In addition, the assembly chamber 1100 is fully made of a transparent material so that its inside can be seen from outside, or at least a bottom surface 1110 of the assembly chamber 1100 may be made of a transparent material so that an assembly surface of an assembly substrate 2000 to be described later can be seen.

Referring to the drawings, the assembly chamber 1100 may have a shape with a top open, and the assembly substrate 2000 may be disposed on a top of the assembly chamber 1100. The assembly substrate 2000 may include assembly electrodes for generating an electric field during self-assembly, and pocket-shaped cells in which the semiconductor light emitting diodes 1050 are seated. The semiconductor light emitting diodes 1050 may be seated on a surface (hereinafter, referred to as an assembly surface) on which the components are disposed through self-assembly, and the assembly substrate 2000 may be disposed such that its assembly surface is immersed in the fluid with facing the bottom surface of the assembly chamber 1100. Accordingly, when the bottom surface of the assembly chamber 1100 is made of the transparent material, the assembly surface can be seen from a lower side of the assembly chamber 1100.

According to the present disclosure, the self-assembling device 1000 may include a sensor unit 1400 disposed below the assembly chamber 1100 to monitor the inside of the assembly chamber 1100. The sensor unit 1400 is configured as an image sensor including an inverted type lens and a CCD, so as to monitor the assembly surface in real time through the bottom surface of the assembly chamber 1100.

The assembly substrate 2000 may be transferred to a top of the assembly chamber 1100 by the substrate chuck 1300 and supported while self-assembly is in progress. Although not specifically illustrated in the drawings, for this purpose, the substrate chuck 1300 may include a transfer part and a support part. The transfer part may transfer the substrate chuck 1300 in horizontal and vertical directions, and the support part may support edges of the assembly substrate 2000. For example, the support part may support two facing sides or all sides of the assembly substrate 2000, and support methods may vary.

The substrate chuck 1300 may include a power supply part (not illustrated) in addition to the transfer part and the support part. The power supply part may be provided on the side of the support part supporting the assembly substrate 2000 and may be connected to assembly electrodes formed on the assembly substrate 2000 to apply power to the assembly electrodes during self-assembly so as to form an electric field on the assembly surface.

A magnetic chuck 1200 may be disposed above the assembly 2000. That is, the assembly substrate 2000 may be disposed between the assembly chamber 1100 and the magnetic chuck 1200.

The magnetic chuck 1200 may apply magnetic force to induce a movement of the semiconductor light emitting diodes 1050 in the assembly chamber 1100 while moving in a horizontal direction. To this end, the magnetic chuck 1200 may include a plurality of magnets and a transfer part. The transfer part may transfer the magnetic chuck 1200 in horizontal and vertical directions. The vertical movement of the magnetic chuck 1200 is for adjusting a distance between the assembly substrate 2000 and the plurality of magnets, and the horizontal movement of the magnetic chuck 1200 is for semiconductor light emitting diodes to be self-assembled on an entire region of the assembly substrate 2000. Accordingly, the horizontal direction herein may mean a direction parallel to the assembly surface of the assembly substrate 2000.

Meanwhile, all of the operations, including the transfer, of the magnetic chuck 1200 and the substrate chuck 1300 may be controlled by the control part. The control part may be a known component provided to control operations of the device, and a detailed description of the control part will be omitted.

Hereinafter, referring to FIGS. 11 and 12, the magnetic chuck 1200 constituting the self-assembly device 1000 of the present disclosure will be described in detail.

According to the present disclosure, the magnetic chuck 1200 may include a magnetic force generating part 1210 and a vacuum forming part 1220. The magnetic force forming part 1210 may be a component for applying magnetic force to the semiconductor light emitting diodes 1050, and the vacuum forming part 1220 may be a component for correcting the bending (warpage) of the assembly substrate 2000.

First, the magnetic force generating part 1210 may include a plurality of magnets arranged in a plurality of rows and columns. The plurality of magnets may include assembly magnets 1212, first cushion magnets 1213, and second cushion magnets 1214.

The magnetic force forming part 1210 may include magnet accommodating portions 1211 arranged in a plurality of rows and columns. The magnet accommodating portions 1211 may have spaces each having a predetermined width and depth to accommodate some of the plurality of magnets. In addition, each of the magnet accommodating portions 1211 may include an opening 1211a formed at a portion adjacent to the assembly substrate 2000.

The assembly magnets 1212 for applying the magnetic force to the semiconductor light-emitting diodes 1050 during self-assembly may be disposed in the magnet accommodating portions 1211. A width (or diameter) of the assembly magnet 1212 may be smaller than a width of the space defined in the magnet accommodating portion 1211 so that the assembly magnet 1212 can be disposed in the magnet accommodating portion 1211. On the other hand, a length of the assembly magnet 1212 may be longer than a depth of the space defined in the magnet accommodating portion 1211, so that a portion of the assembly magnet 1212 can be exposed through the opening 1211a.

According to the present disclosure, a distance (gap, interval) between the magnetic chuck 1200 and the assembly substrate 2000 may mean a distance between one surface of the assembly magnet 1212, which is exposed through the opening 1211a to be closest to the assembly substrate 2000, and the assembly substrate 2000. In order for the magnetic force formed by the assembly magnets 1212 to affect the semiconductor light emitting diodes 1050 accommodated in the assembly chamber 1100, the distance between the one surface of the assembly magnet 1212 and the assembly substrate 2000 should be maintained within a predetermined range. Specifically, the one surface of the assembly magnet 1212 and the assembly substrate 2000 may be disposed at a distance of 2 mm or less.

The assembly magnet 1212 may move up and down within the magnet accommodating portion 1211 along a longitudinal direction of the assembly magnet 1212 during self-assembly, and may be separated from the magnetic chuck 1200 after the self-assembly. That is, the assembly magnet 1212 may be detachable from the magnet chuck 1200.

The magnetic chuck 1200 may include first and second cushion magnets 1213 and 1214 to adjust the vertical movement of the assembly magnets 1212. The first and second cushion magnets 1213 and 1214 may be provided in a state of being fixed to the magnetic chuck 1200 and spaced apart from the assembly magnet 1212, and apply attractive or repulsive force to the assembly magnets 1212 to adjust the vertical movement of the assembly magnets 1212. Since the first and second cushion magnets 1213 and 1214 do not directly involve in self-assembly of the semiconductor light emitting diodes 1050 but play a role of finely adjusting vertical positions of the assembly magnets 1212, the first and second cushion magnets 1213 and 1214 may have sizes smaller than the assembly magnets 1212.

In this embodiment, the first cushion magnet 1213 may be disposed outside the magnet accommodating portion 1211, and the second cushion magnet 1214 may be disposed to be fixed to one inner surface of the magnet accommodating portion 1211. That is, the plurality of magnets may be arranged in the order of the first cushion magnet 1212, the second cushion magnet 1214, and the assembly magnet 1212 such that centers of the magnets are arranged on the same line. At this time, the line on which the centers of the magnets are arranged may become an axis of the vertical movement of the assembly magnet 1212.

On the other hand, the assembly magnet 1212 may move in the vertical direction by the interaction with the first and second cushion magnets 1213 and 1214. Specifically, in order for a repulsive force to act between the assembly magnet 1212 and the first cushion magnet 1213, the plurality of magnets may be arranged such that a repulsive force acts between the first cushion magnet 1213 and the second cushion magnet 1214 and an attractive force acts between the second cushion magnet 1214 and the assembly magnet 1212. When the repulsive force directly acts between the first cushion magnet 1213 and the assembly magnet 1212, the position of the assembly magnet 1212 is not fixed. Therefore, the second cushion magnet 1214 may be disposed between the first cushion magnet 1213 and the assembly magnet 1212 to serve as an intermediate layer. The assembly magnet 1212 may be adjusted in a vertical position with or without being coupled to the second cushion magnet 1214. As the vertical position of the assembly magnet 1212 is adjusted, a length of a portion of the assembly magnet 1212 exposed through the opening 1211a can be adjusted.

Next, the vacuum forming part 1220 may include a plurality of vacuum holes 1221 disposed between the plurality of magnets. The vacuum holes 1221 may be formed in a shape of hole or line between a plurality of magnets.

One side of each of the vacuum holes 1221 may be connected to a vacuum pump (not illustrated), and vacuum pressure may be applied to the assembly substrate 2000 through another side of the vacuum hole 1221. In another embodiment, vacuum pads may be provided on the another sides of the vacuum holes 1221, and at this time, the assembly substrate 2000 may be adsorbed on the vacuum pads.

The magnetic chuck 1200 can adjust a warpage phenomenon of the assembly substrate 2000 by applying vacuum pressure to the assembly substrate 2000 in a region other than a region where the magnetic force is applied during self-assembly in which the magnetic force is applied to the semiconductor light emitting diodes 1050. Accordingly, a constant distance can be maintained between the assembly magnets 1212 and the assembly substrate 2000.

Hereinafter, a method for self-assembling semiconductor light-emitting diodes using the self-assembly device 1000 will be described with reference to FIGS. 13 to 15. In the following description, a description of the configuration of the self-assembling device 1000 will be replaced with the previous description.

Figure 13:
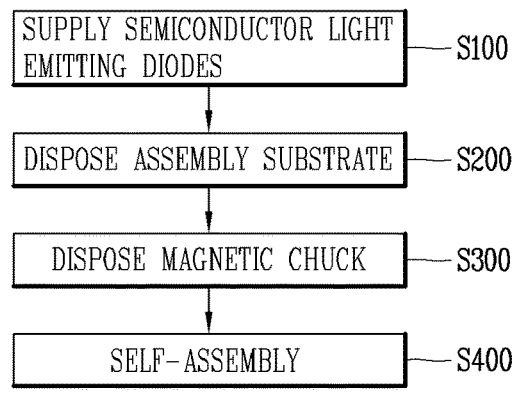
FIG. 13 is a flowchart illustrating a self-assembling method in accordance with the present disclosure.
Figure 14:
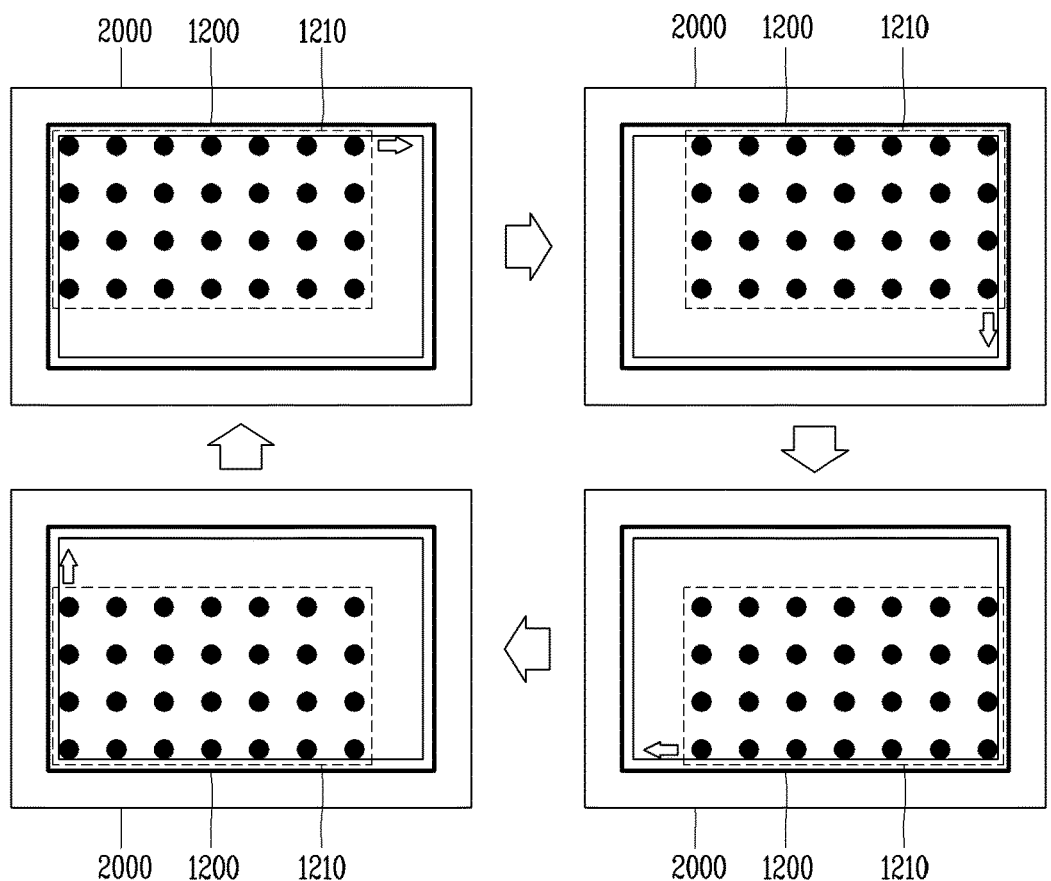
FIG. 14 is a conceptual view for explaining a horizontal movement of a magnetic chuck in a self-assembly method according to the present disclosure.
Figure 15:
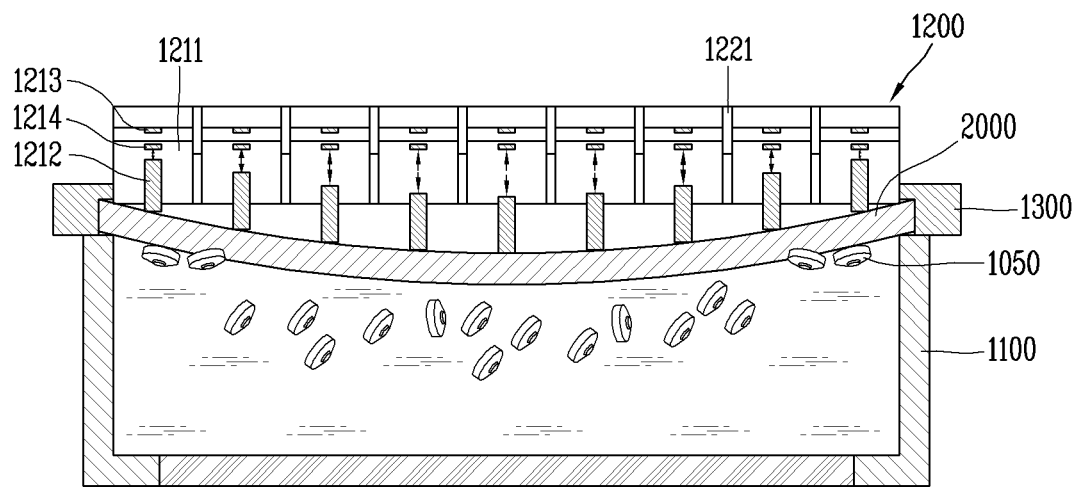
FIG. 15 is a conceptual view for explaining a vertical movement of assembly magnets in a self-assembly method according to the present disclosure.

FIG. 13 is a flowchart illustrating a self-assembling method in accordance with the present disclosure, FIG. 14 is a conceptual view for explaining a horizontal movement of a magnetic chuck in a self-assembly method according to the present disclosure, and FIG. 15 is a conceptual view for explaining a vertical movement of assembly magnets in a self-assembly method according to the present disclosure.

According to the present disclosure, first, a step of supplying the semiconductor light-emitting diodes 1050 into the assembly chamber 1100 which contains a fluid (S100) may be performed. A description of the fluid and the semiconductor light emitting diodes 1050 supplied into the assembly chamber 1100 will be replaced with the previous description. After the fluid is supplied to the assembly chamber 1100, the semiconductor light emitting diodes 1050 may be supplied. The semiconductor light emitting diodes 1050 may be supplied in a uniform amount within a predetermined error range to each of a plurality of preset positions inside the assembly chamber 1100, and may be continuously supplied in a direction in which the preset positions are arranged. The plurality of preset positions may be positions corresponding to cells of the assembly substrate 2000.

Next, a step of disposing the assembly substrate 2000 on a top of the assembly chamber 1100 (S200) may be performed. The assembly substrate 2000 may be disposed on the top of the assembly chamber 1100 by the substrate chuck 1300. The assembly substrate 2000 includes assembly electrodes and cells in which the semiconductor light emitting diodes 1050 are seated, and a surface of the assembly substrate 200 on which the assembly electrodes and cells are formed corresponds to the assembly surface. The assembly substrate 2000 may be disposed such that the assembly surface is immersed in the fluid while facing the bottom surface of the assembly chamber 1100.

Describing the process of arranging the assembly substrate 2000 in detail, the assembly substrate 2000 may be supported on the substrate chuck 1300 with the assembly surface facing upward, and the substrate chuck 1300 may be rotated by 180 degrees such that the assembly surface faces downward. In this state, the assembly substrate 2000 may be disposed on the top of the assembly chamber 1100. In addition, when the assembly substrate 2000 is disposed on the top of the assembly chamber 1100, the assembly substrate 2000 may be moved downward until the assembly surface is immersed in the fluid. In the state where the assembly surface of the assembly substrate 2000 is immersed in the fluid, a portion not supported by the substrate chuck 1300, in particular, the central portion of the assembly substrate 2000 may be warped toward the bottom surface of the assembly chamber 1100 by gravity.

Next, a step of disposing the magnetic chuck 1200 above of the assembly substrate 2000 (S300) may be performed. The magnetic chuck 1200 may correct the warpage phenomenon of the assembly substrate 2000 while applying magnetic force to the semiconductor light emitting diodes 1050 in the assembly chamber 1100.

The magnetic chuck 1200 may be disposed to have a distance from the assembly substrate 2000 within a predetermined range so that the magnetic force formed by the assembly magnets 1212 can be applied to the semiconductor light emitting diodes 1050. Preferably, the magnetic chuck 1200 may be disposed such that one surface of the assembly magnet 1212 has a gap (distance, interval) of 2 mm or less from the assembly substrate 2000. As will be described later, the process of applying the magnetic force to the semiconductor light emitting diodes 1050 to induce the movement of the semiconductor light emitting diodes 1050 may be performed while the assembly magnet 1212 is in contact with the assembly substrate 2000. However, in order for the magnetic force to act on the semiconductor light emitting diodes 1050 even if the assembly magnet 1212 is not in contact with the assembly substrate 2000, the gap between the one surface of the assembly magnet 1212 and the assembly substrate 2000 should be maintained within 2 mm.

Meanwhile, when the magnetic chuck 1200 is disposed above the assembly substrate 2000, the magnetic chuck 1200 may apply vacuum pressure to the assembly substrate 2000 through the vacuum holes 1221 to correct the warpage of the assembly substrate 2000. Accordingly, the gap between the entire region of the assembly substrate 2000 and the assembly magnet 1212 can be less than 2 mm. In addition, the magnetic chuck 1200 may continuously apply the vacuum pressure to the assembly substrate 2000 until the self-assembly process to be described later is completed, such that the gap between the assembly substrate 2000 and the assembly magnet 1212 can be maintained.

Next, a step of seating the semiconductor light-emitting diodes 1050 on the assembly substrate 2000 (S400) may be performed. This step may be a step corresponding to the self-assembly described herein.

For the self-assembly, the magnetic chuck 1200 may move down a little more so that the assembly magnet 1212 comes in contact with the assembly substrate 2000. Referring to FIG. 15, as the magnetic chuck 1200 moves downward, some of the assembly magnets 1212, for example, assembly magnets 1212 disposed above an edge region of the assembly substrate 2000 may first be brought into contact with the assembly substrate 2000, and the assembly magnets 1212 disposed above a central region of the assembly substrate 2000 may be brought into contact with the assembly substrate 2000 while their vertical positions are controlled by interaction with the first and second cushion magnets 1213 and 1214. In this case, the control part may control the vertical positions of the assembly magnets 1212 to apply uniform pressure to the assembly substrate 2000 while the assembly magnets 1212 are in contact with the assembly substrate 2000. Meanwhile, FIG. 15 is a view for explaining the process of adjusting the vertical positions of the assembly magnets 1212, and although not illustrated in the drawing, the warped shape of the substrate may be corrected by the vacuum forming part 1220 as described above.

When all of the assembly magnets 1212 come into contact with the assembly substrate 2000 with constant pressure, a step of moving the magnetic chuck 1200 in the horizontal direction may be performed. In this step, the semiconductor light emitting diodes 1050 may be induced to move up toward the assembly surface and then move horizontally within the assembly chamber 1100. As illustrated in FIG. 14, as the magnetic chuck 1200 moves horizontally, self-assembly over the entire region of the assembly substrate 2000 may be performed. In this process, at least some of the assembly magnets 1212 may further move in the vertical direction, thereby adjusting the gap from the assembly substrate 2000 and pressure applied to the assembly substrate 2000 in the contact state with the assembly substrate 2000.

Meanwhile, a step of applying power to some of the assembly electrodes such that the semiconductor light emitting diodes 1050, which are induced toward the assembly surface by the magnetic force and moved horizontally, are seated in the cells may be performed. When power is applied to the assembly electrodes, an electric field may be formed in the corresponding region, and the semiconductor light emitting diodes 1050 may be seated in the cells by dielectrophoresis. Specifically, power may be applied to at least some of the assembly electrodes overlapping the assembly magnets 1212 among the assembly electrodes, and power may be applied simultaneously or sequentially to all of the assembly electrodes overlapping the assembly magnets 1212.

The foregoing description is merely illustrative to explain the technical idea of the present disclosure, and it will be apparent to those skilled in the art that various modifications and variations can be made without departing from the essential characteristics of the present disclosure.

Therefore, the embodiments disclosed in the present disclosure are not intended to limit the technical spirit of the present disclosure, but to explain, and the scope of the technical spirit of the present disclosure is not limited by these embodiments.

The scope of the present disclosure should be construed according to the claims below, and all technical ideas within the scope equivalent thereto should be construed as being included in the scope of the present disclosure.

The invention claimed is:

1. A device for self-assembling semiconductor light-emitting diodes, the device comprising:
    an assembly chamber in which a fluid and the semiconductor light emitting diodes are accommodated;
    a magnetic chuck disposed above the assembly chamber and configured to apply magnetic force, while moving in a horizontal direction, to induce movement of the semiconductor light emitting diodes within the assembly chamber;
    a substrate chuck configured to dispose an assembly substrate, on which the semiconductor light emitting diodes inside the assembly chamber are to be seated, between the assembly chamber and the magnetic chuck and to support the assembly substrate; and
    a control part configured to control operations of the magnetic chuck and the substrate chuck,
    wherein the magnetic chuck comprises:
    a magnetic force forming part including a plurality of magnets; and
    a vacuum forming part configured to correct a bending phenomenon of the assembly substrate by using vacuum pressure between the plurality of magnets so that a predetermined distance is maintained between one side of the magnetic chuck and the assembly substrate.

2. The device of claim 1, wherein the magnetic force forming part comprises:
    magnet accommodating portions arranged in a plurality of rows and columns and having spaces for accommodating some of the plurality of magnets;
    assembly magnets disposed in the magnet accommodating portions; and
    first cushion magnets disposed outside the magnet accommodating portions to be spaced apart from the assembly magnets, respectively.

3. The device of claim 2, wherein the magnet accommodating portion includes an opening at one side thereof adjacent to the assembly substrate, and
    wherein a portion of the assembly magnet is exposed through the opening.

4. The device of claim 3, wherein the magnetic force forming part further comprises second cushion magnets each disposed between the first cushion magnet and the assembly magnet, and
    wherein each of the second cushion magnets is fixedly disposed on one surface inside the magnet accommodating portion.

5. The device of claim 4, wherein a repulsive force acts between the first cushion magnet and the second cushion magnet, and an attractive force acts between the second cushion magnet and the assembly magnet.

6. The device of claim 1, wherein the vacuum forming part comprises vacuum holes disposed between the plurality of magnets, and each having one side connected to a vacuum pump to apply vacuum pressure to the assembly substrate.

7. The device of claim 1, wherein the substrate chuck comprises a power supply part for applying power to the assembly substrate so that an electric field is formed on one surface of the assembly substrate.

8. The device of claim 2, wherein the magnetic chuck is disposed so that one side of the magnetic chuck and the assembly substrate have a gap of 2 mm or less, and
    wherein the one side of the magnetic chuck is one surface of the assembly magnet adjacent to the assembly substrate.

9. The device of claim 1, further comprising a sensor unit disposed below the assembly chamber to monitor the inside of the assembly chamber.

10. A method for self-assembling semiconductor light-emitting diodes, the method comprising:
    supplying the semiconductor light-emitting diodes into an assembly chamber containing a fluid;
    disposing an assembly substrate on a top of the assembly chamber, the assembly substrate including assembly electrodes and cells on which the semiconductor light emitting diodes are seated;
    disposing a magnetic chuck above the assembly substrate, the magnetic chuck including a magnetic force forming part including a plurality of magnets and a vacuum forming part; and
    seating the semiconductor light-emitting diodes on the assembly substrate using a magnetic field and an electric field,
    wherein vacuum pressure is continuously applied to the assembly substrate by the vacuum forming part while the step of seating the semiconductor light emitting diodes on the assembly substrate is in progress.

11. The method of claim 10, wherein the magnetic force forming part comprises:
    magnet accommodating portions arranged in a plurality of rows and columns and having spaces for accommodating some of the plurality of magnets;
    assembly magnets disposed in the magnet accommodating portions; and
    first cushion magnets disposed outside the magnet accommodating portions to be spaced apart from the assembly magnets, respectively.

12. The method of claim 11, wherein the magnetic force forming part further comprises second cushion magnets each disposed between the first cushion magnet and the assembly magnet, and
    wherein each of the second cushion magnets is fixedly disposed on one surface inside the magnet accommodating portion.

13. The method of claim 11, wherein the arranging the magnetic chuck is configured such that the assembly substrate and one surface of the assembly magnet adjacent to the assembly substrate have a gap of 2 mm or less.

14. The method of claim 11, wherein the seating the semiconductor light emitting diodes on the assembly substrate is configured such that an electric field is formed as power is applied to the assembly electrodes.

15. The method of claim 14, wherein the seating the semiconductor light emitting diodes on the assembly substrate comprises:
moving the magnetic chuck in a horizontal direction; and
applying power to at least some of the assembly electrodes overlapping the assembly magnets.

16. The method of claim 15, wherein at least some of the assembly magnets are further moved in a vertical direction during a process of moving the magnetic chuck in the horizontal direction.

* * * * *